United States Patent [19]

Scherba

[11] 4,236,127
[45] * Nov. 25, 1980

[54] ELECTRICAL FREQUENCY RESPONSIVE STRUCTURE

[75] Inventor: Michael B. Scherba, Troy, Mich.

[73] Assignee: Pyrohm, Inc., Farmington Hills, Mich.

[*] Notice: The portion of the term of this patent subsequent to Dec. 5, 1995, has been disclaimed.

[21] Appl. No.: 949,045

[22] Filed: Oct. 6, 1978

Related U.S. Application Data

[63] Continuation-in-part of Ser. No. 787,011, Apr. 13, 1977, Pat. No. 4,128,818.

[51] Int. Cl.$^3$ ............................................ H03H 5/00
[52] U.S. Cl. ..................................... 333/175; 333/185; 336/115; 336/129; 455/286; 455/290; 455/292
[58] Field of Search .................. 358/167; 333/76, 705, 333/70 R; 336/115, 129, 220; 325/379, 380, 383, 376, 377; 455/286, 287, 290, 292

[56] References Cited

U.S. PATENT DOCUMENTS

| | | | |
|---|---|---|---|
| 2,779,924 | 1/1957 | Du Chatellier | 325/379 |
| 2,925,495 | 2/1960 | Mason et al. | 336/129 |
| 2,958,930 | 11/1960 | Heazel, Jr. et al. | 336/129 |
| 3,111,636 | 11/1963 | Ima | 333/76 |
| 3,980,975 | 9/1976 | Maxon, Jr. | 333/185 |

OTHER PUBLICATIONS

An Intro. to the Theory and Design of Electric Wave Filters-F. Scowen, 2nd Edition, Chapman & Hall Ltd., 1950 pp. 49-52.
Lafayette Radio Electronics Catalog 700, 1970, pp. 392.
Reference Data for Radio Engineers-Fifth Edition, Howard W. Sams & Co., Inc. Copyright 1968, pp. 7-10.

*Primary Examiner*—Marc E. Bookbinder
*Attorney, Agent, or Firm*—Whittemore, Hulbert & Belknap

[57] ABSTRACT

An electrical frequency responsive circuit comprising a first coil constructed of wire having an insulating coating thereon wound in a single layer about an axis of generation, and a second coil, also constructed of wire having an insulating coating thereon wound about an axis of generation in a single layer, said coils being axially related and having diameters and/or pitch to provide inductance and capacitance between the coils which is at least initially adjustable whereby the circuit is responsive to an electric signal having a predetermined electrical frequency imposed across the coils to provide frequency band suppression about the predetermined frequency.

6 Claims, 15 Drawing Figures

ELECTRICAL FREQUENCY RESPONSIVE STRUCTURE

CROSS REFERENCE TO RELATED APPLICATIONS

This application is a continuation-in-part of my copending application Ser. No. 787,011, filed Apr. 13, 1977, now U.S. Pat. No. 4,128,818.

BACKGROUND OF THE INVENTION

1. Field of the Invention

The invention relates to electrical frequency responsive structures, and refers more specifically to a frequency band suppression circuit comprising a pair of coils related in diameter and/or pitch, one of which is positioned within the other axially to provide a predetermined capacitance and inductance between the coils responsive to a frequency band it is desired to suppress.

2. Description of the Prior Art

In the past, electrical frequency responsive circuits have been used in many fields to reduce interference with the operation of particular equipment by electrical signals of predetermined frequencies. Thus, interference with television reception by citizen band radio operators or amateur radio operators is a problem without frequency responsive structure at the input of the television, such as a frequency band suppression circuit tuned to suppress the particular band of frequencies causing interference, or such as a high frequency pass circuit for suppressing all frequencies below a lower television frequency.

Prior frequency responsive circuits have usually been constructed of separate coils and capacitors soldered together, which have then been connected across a pair of conductors such as the conductors in the usual television cable between the television antenna and receiver. In the simplest case, a frequency band suppression filter circuit is a series connected coil and capacitor tuned to a particular frequency which it is desired to suppress.

Such structure requires the soldering of separate elements, one of which must be variable if the circuit is not pre-tuned. Such filters often become elaborate and therefore expensive.

SUMMARY OF THE INVENTION

In accordance with the invention, an electrical frequency responsive circuit is provided which includes a first coil constructed of a wire having an insulating coating thereon wound in a single layer about an axis of generation, and a second coil constructed of wire having an insulating coating thereon wound about the same axis of generation. The two coils are positioned together with their axis of generation substantially congruent and with their diameter and/or pitch so related that they provide a predetermined inductance and capacitance which may be at least initially adjusted.

In one embodiment, the inner diameter of the first coil is slightly smaller than the outer diameter of the second coil and the coils are screwed together at one end. Means are provided on the other end of each of the coils for connecting the coils to an electrical circuit.

With such arrangement, the inductance and capacitance of the assembled coils is varied by the distance the smaller coil is positioned within the larger coil. The assembled coils then provide an electrical frequency band suppression circuit responsive to a frequency which is a function of how far the smaller coil extends into the larger coil.

The assembled coils may be placed across the input conductors of a television set and when tuned to approximately 27 megahertz will provide frequency band suppression for the usual citizen band radio interference.

In another modification of the invention, both ends of one of the coils are free and means are provided on both ends of the other coil for connecting the other coil to an electrical circuit.

In a third modification of the invention, both coils have a pitch at one end such that the space between the adjacent convolution thereof is equal to the diameter of the wire of which the other coil is constructed and the coils are of substantially the same diameter, whereby on screwing the one ends of the coils together, each convolution of each coil is separated from adjacent convolutions of the same coil by a convolution of the other coil, and the one ends of both coils are free, while means are provided on the other ends of both coils for connecting the electrical frequency responsive circuit to another electrical circuit.

In a fourth modification of the invention, each coil again has a pitch such that the space between the adjacent convolutions thereof is equal to the diameter of the wire of which the other coil is constructed, and both coils are of substantially the same diameter, whereby on screwing the coils together, each convolution of each coil is separated from adjacent convolutions of the same coil by a convolution of the other coil. In this modification, both ends of one of the coils are free, while both ends of the other of the coils are provided with means for securing the electrical frequency responsive circuit in another electrical circuit.

A plurality of such electrical frequency responsive circuits may be connected together to provide filters other than frequency band suppression circuits such as high frequency pass circuits, low frequency pass circuits, and frequency band pass circuits.

For example, in a configuration wherein three of the frequency responsive circuits of the invention are connected, two of them across the conductors of a television cable and the other in one of the conductors between the other two, a frequency band pass circuit is produced which may be tuned to suppress all frequencies below a lower television frequency of 54 megahertz.

DESCRIPTION OF THE PREFERRED EMBODIMENTS

Figure 1:
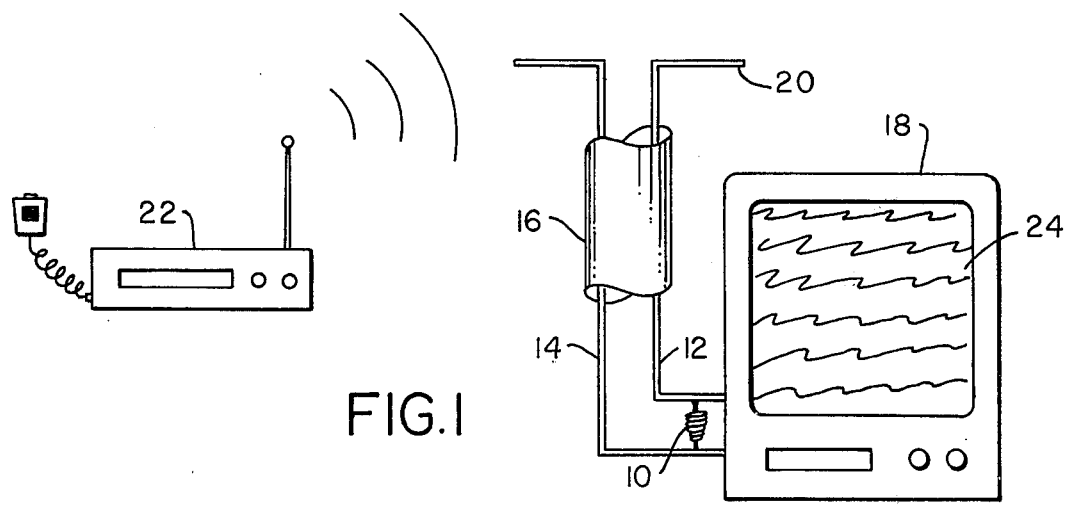
FIG. 1 is a diagrammatic representation of a television receiver receiving interference from a citizen band transmitter, which television set includes an electrical frequency band suppression circuit constructed in accordance with the invention in combination therewith.

As shown in FIG. 1, the electrical frequency responsive circuit 10 is connected across the conductors 12 and 14 in the cable 16 positioned between a television set 18 and the television antenna 20. The circuit 10, as shown in FIG. 1, is tuned to suppress a band of frequencies around 27 megahertz which is the operating frequency of the citizen band radio 22 producing the interference shown on the screen 24 of the television set 18.

Figures 2, 3, 4:
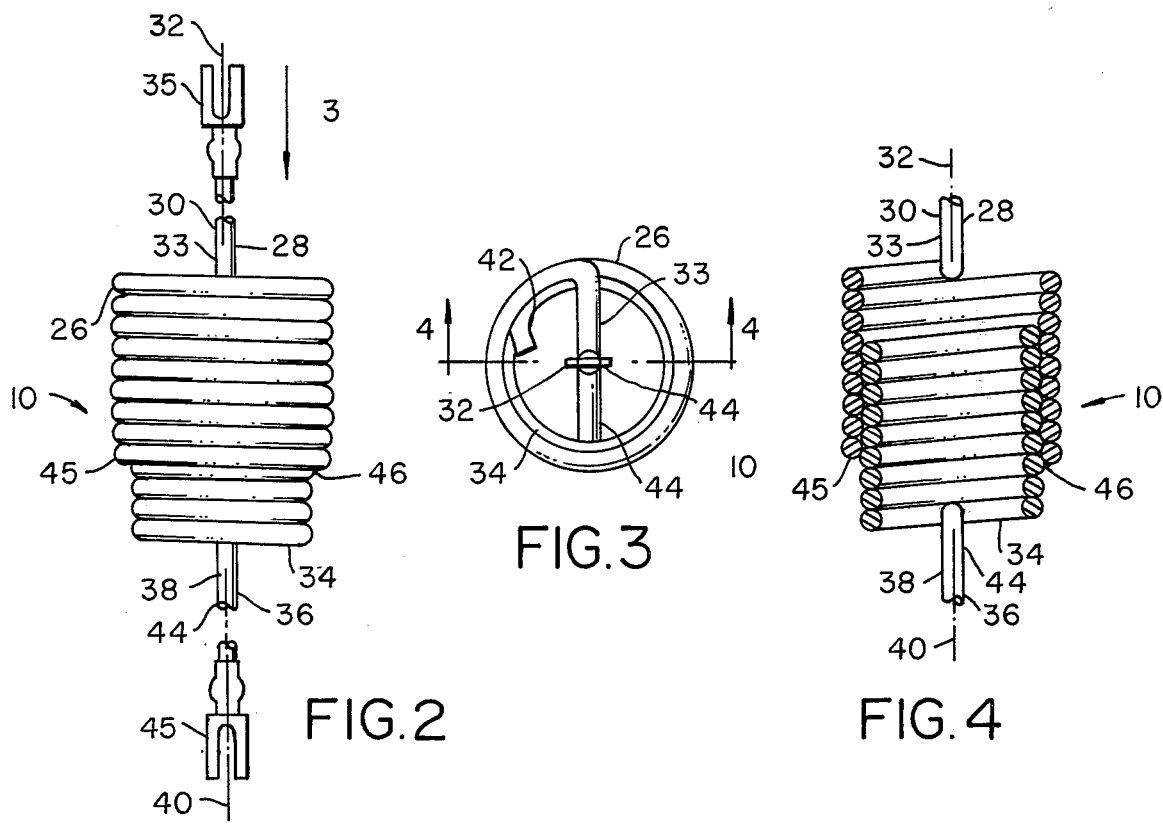
FIG. 2 is an elevation view of an electrical frequency responsive circuit constructed in accordance with the invention.
FIG. 3 is an end view of the electrical frequency responsive circuit of FIG. 2, taken in the direction of arrow 3 in FIG. 2.
FIG. 4 is a section view of the electrical frequency responsive circuit illustrated in FIGS. 2 and 3, taken substantially on the line 4—4 in FIG. 3.

More particularly, the electical frequency responsive circuit 10, as shown best in FIGS. 2-4, includes a first coil 26. The coil 26 is constructed of wire 28 which is an electrical conductor and which is coated with an electrical insulating material 30. The coil 26 is wound about an axis of generation 32 in the configuration shown. The end 33 of the coil 26 is turned radially inwardly and then along the axis of generation 32 of coil 26 as shown. Means 35 are provided on end 33 of the coil 26 to permit coupling coil 26 in an electric circuit.

The electrical frequency responsive circuit 10 further includes a second coil 34 which again is constructed of a wire 36 which is an electrical conductor and which has an electrical insulating coating 38 thereon. The wire 36 is wound in the configuration shown about an axis of generation 40. As shown, the one end 42 of the coil 34 is terminated in a portion extending radially inwardly of the coil 34. The other end 44 of the coil 34 is turned radially inwardly and then along the axis of generation 40 of coil 34 and is terminated in coupling member 45 as shown.

In actual practice, the coil 34 may be wound first about axis 40 and the coil 26 may be wound on the coil 34 so that axis 32 is congruent with axis 40. In such case, the coils 26 and 34 are displaced axially relative to each other by about one-half of the radius of the wire of which the coils are formed, as shown.

In assembly of an electrical frequency responsive circuit 10 including separate coils 26 and 32, the one end 42 of the coil 34 over which the coil 26 is wound, which is constructed to have an outer diameter slightly larger than the inner diameter of the coil 26, may be screwed into the one end 45 of the coil 26 as shown best in FIGS. 2 and 4. The coil 34 is positioned within the coil 26 a distance sufficient to provide a desired capacitance and inductance between the ends 33 and 44 of coils 26 and 34, after which the coils may be fixed in such position, which may be predetermined, by convenient means such as adhesive 46.

The frequency to which the coils 26 and 34 are responsive in assembly with each other is determined by the usual parameters for such coils. Some of the usual parameters for determination of the induction are the material of which the wires are made, the diameter of the wire, the number of turns of the wire, and the proximity and orientation of the coils with respect to each other. In the case of the coils assembled as shown in FIGS. 2-4, some of the parameters for determination of capacitance are the distance the coils are overlapping each other, the composition and thickness of the insulating material on the wire, and the distance between the wire portions of the coils.

In one specific example, both coils were approximately 0.4 of an inch long and were constructed of twelve turns of number 20 copper wire having enamel electrical insulation approximately 0.0001 of an inch thick thereon. The larger diameter coil was approximately 0.455 inches in diameter and had an inductance of approximately 1.05 microhenrys. The smaller diameter coil was approximately 0.415 inches in diameter and had an inductance of approximately 0.795 microhenrys. In assembly, the coils were adjusted to provide a combined inductance and distributed capacitance resonent at approximately 27 magahertz, whereby a band of frequencies approximately 2 megahertz wide centered at 27 megahertz were suppressed.

The particular electrical frequency responsive circuit illustrated in FIGS. 2-4 is suitable as an electrical frequency band suppression circuit which may be used to suppress citizen band frequencies of approximately 27 megahertz over a 2 megahertz band width. Such a circuit could directly replace the conventional inductor, capacitor suppression circuit shown in FIG. 5.

Figures 5, 6:
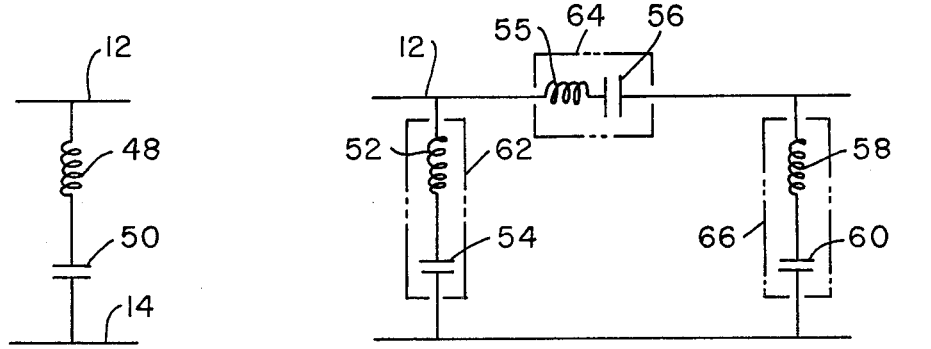
FIG. 5 is an equivalent inductor, capacitance electrical frequency band suppression circuit.
FIG. 6 is an equivalent band pass circuit.

Three such electrical frequency responsive circuits as shown in FIGS. 2-4 may be utilized in the configuration shown in FIG. 6 to replace the capacitors 54 and 56 and 60 and the inductors 52, 55 and 58, one in place of each of the circuits within the dotted lines 62, 64 and 66. Such a configuration may be tuned to present a band pass filter permitting all frequencies, for example, above 54 megahertz, to pass to a television set, whereby all interfering frequencies below 54 megahertz are suppressed.

Figure 7:
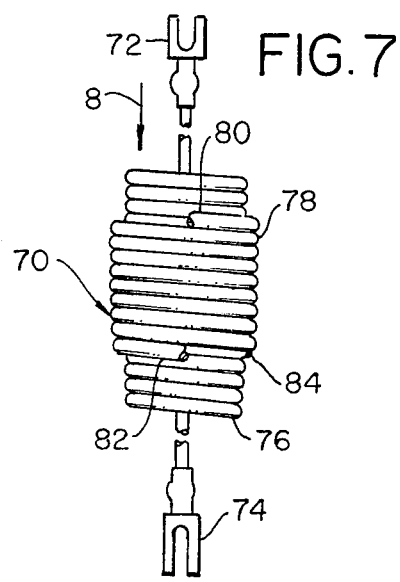
FIG. 7 is an elevation view of another embodiment of the electrical frequency responsive circuit.
Figure 8:
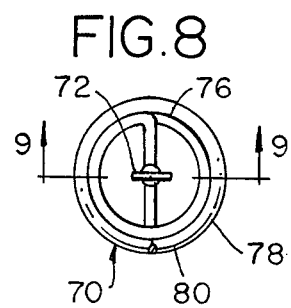
FIG. 8 is an end view of the electrical frequency responsive circuit of FIG. 7, taken in the direction of arrow 8 in FIG. 7.
Figure 9:
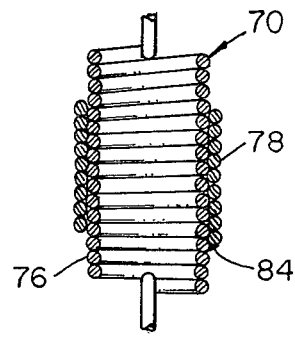
FIG. 9 is a section view of the electrical frequency responsive circuit illustrated in FIGS. 7 and 8, taken substantially on the line 9—9 in FIG. 8.

In the embodiment 70 of the electrical frequency responsive circuit of the invention illustrated in FIGS. 7-9, means 72 and 74 are provided at the opposite ends of the smaller coil 76 for connecting the electrical frequency responsive circuit 70 into another electrical circuit such as between the leads 12 and 14 to the television set 18. The larger coil 78 is provided with two free ends 80 and 82 and again is screwed over the coil 76 to provide a predetermined inductance and capacitance resonant at a predetermined frequency. The coils can be locked together by convenient means such as adhesive 84 in a relation to provide the predetermined frequency. Insulating material is provided on the coils 76 and 78, as before.

Figure 10:
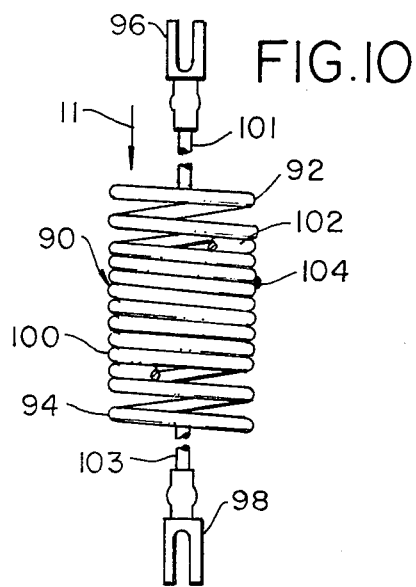
FIG. 10 is an elevation view of a third embodiment of the electrical frequency responsive circuit.
Figure 11:
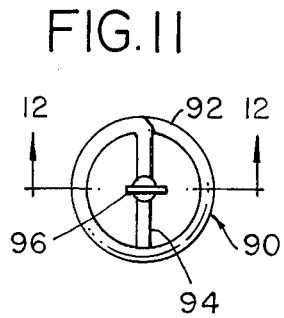
FIG. 11 is an end view of the electrical frequency responsive circuit of FIG. 10, taken in the direction of arrow 11 in FIG. 10.
Figure 12:
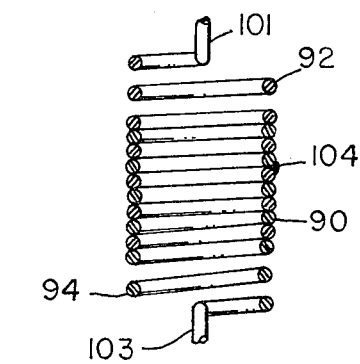
FIG. 12 is a section view of the electrical frequency responsive circuit illustrated in FIGS. 10 and 11, taken substantially on the line 12—12 in FIG. 11.

In the third embodiment 90 of the electrical frequency responsive circuit of the invention, the coils 92 and 94 have substantially the same diameter but have a pitch such that the distance between the convolutions of both coils is equal to the diameter of the wire of the other coil, as shown best in FIG. 12. In the electrical frequency responsive circuit 90, structures 96 and 98 are provided on the opposite ends 101 and 103 of the coils 92 and 94 for securing the opposite ends of the coils to an electrical circuit. The other ends 100 and 102 of the coils 92 and 94 are free. The free ends of the coils are wound together, as shown in FIGS. 10–12 to provide a predetermined inductance and capacitance resonent at the desired frequency. Again, the coils 92 and 94 are provided with insulating material thereon and may be secured together in a fixed position by for example adhesive 104.

Figure 13:
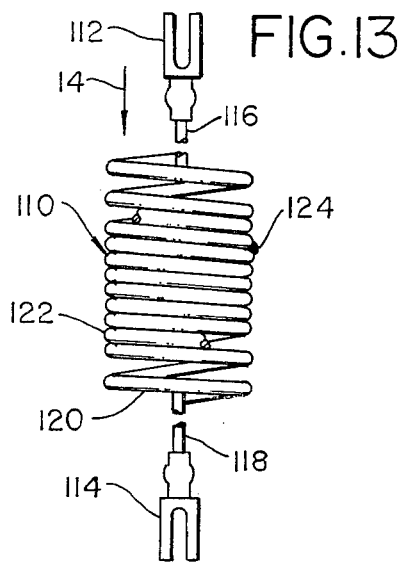
FIG. 13 is an elevation view of a fourth embodiment of the electrical frequency responsive circuit.
Figure 14:
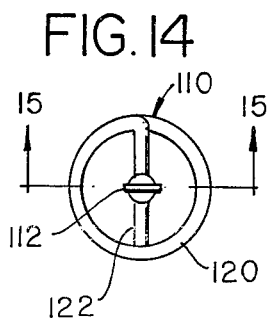
FIG. 14 is an end view of the electrical frequency responsive circuit of FIG. 13, taken in the direction of arrow 14 in FIG. 13.
Figure 15:
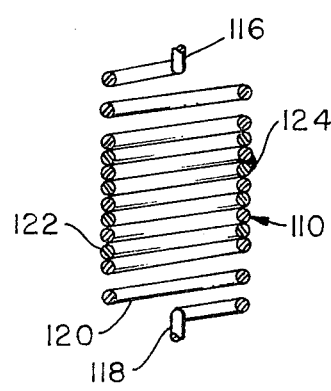
FIG. 15 is a section view of the electrical frequency responsive circuit illustrated in FIGS. 13 and 14, taken substantially on the line 15—15 in FIG. 14.

In the fourth embodiment 110 of the electrical frequency responsive circuit of the invention shown in FIGS. 13–15, the means 112 and 114 for securing the electrical frequency responsive circuit 110 into another electrical circuit is secured to the ends 116 and 118 of one of the coils 120. The other coil 122 is wound into the coil 118 to provide the required capacitance and inductance whereby the electrical frequency responsive circuit 110 is resonant at the predetermined frequency. As shown best in FIG. 15, the pitch of the coils 120 and 122 is similar to the pitch of the coils 92 and 94, and the radius of the coils is substantially the same. Again, insulating material is provided on the coils to separate the coils from direct electrical contact and adhesive 124 may secure the coils 120 and 122 in a fixed position relative to each other.

It will be understood that other embodiments of the electrical frequency responsive circuit of the invention are possible on variation of the diameter and pitch of the coils. Thus, for example, in the electrical frequency responsive circuit 70, the electrical connectors could be positioned on the opposite ends of the larger coil, with the smaller coil screwed into the larger coil and having free ends. Also, by varying the diameter of the respective coils and the pitch of the coils, the relative position of the coils when screwed into each other may be varied as required to meet mechanical and/or electrical construction conditions.

While the electrical frequency responsive circuit 10 has been considered in combination with a television set cable and antenna, it will be understood that such an electrical frequency responsive circuit has many other applications.

Accordingly, it is not intended to limit embodiments, modifications or application of the circuit 10. Rather, it is intended to include within the scope of the invention all of the embodiments and modifications of the frequency responsive circuit as are defined by the appended claims in all applications thereof.

What I claim as my invention is:

1. An electrical frequency responsive circuit comprising a first electrical coil having an axis of generation and a second electrical coil positioned to overlap the first electrical coil both axially and radially so that the frequency responsive circuit is resonant at a predetermined frequency, the second coil having an inner diameter slightly smaller than the outer diameter of the first coil, the coils being screwed together, insulating material extending radially between the first and second coils and means at the opposite ends of the electrical frequency responsive circuit for connecting the electrical frequency responsive circuit in another electrical circuit.

2. Structure as set forth in claim 1, wherein the means for connecting the electrical frequency responsive structure in another electrical circuit are provided at the opposite ends of the same coil.

3. Structure as set forth in claim 1, wherein the means for connecting the electrical frequency responsive structure in another electrical circuit are provided at the opposite end of the first and second coils.

4. An electrical frequency responsive circuit comprising a first electrical coil having an axis of generation, a second electrical coil having an axis of generation and positioned to overlap the first electrical coil both axially and radially so that the frequency responsive circuit is resonant at a predetermined frequency, said coils being constructed of electrical wire and having substantially the same diameter, each having a pitch such that the space between adjacent convolutions thereof is substantially equal to the diameter of the wire of the other coil and the coils being screwed into each other whereby adjacent convolutions of each coil are separated by a convolution of the other coil, insulating material extending between the first and second coils and means at the opposite ends of the electrical frequency responsive circuit for connecting the electrical frequency responsive circuit in another electrical circuit.

5. Structure as set forth in claim 4, wherein the means for connecting the electrical frequency responsive structure in another electrical circuit are provided at the opposite ends of the same coil.

6. Structure as set forth in claim 4, wherein the means for connecting the electrical frequency responsive structure in another electrical circuit are provided at the opposite end of the first and second coils.

* * * * *